(12) United States Patent
Kim et al.

(10) Patent No.: US 9,419,164 B2
(45) Date of Patent: Aug. 16, 2016

(54) SOLAR CELL MODULE HAVING INTERCONNECTOR AND METHOD OF FABRICATING THE SAME

(75) Inventors: Jongdae Kim, Seoul (KR); Jongkyoung Hong, Seoul (KR); Giwon Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 167 days.

(21) Appl. No.: 12/691,586

(22) Filed: Jan. 21, 2010

(65) Prior Publication Data

US 2011/0005568 A1    Jan. 13, 2011

(30) Foreign Application Priority Data

Jul. 7, 2009 (KR) .................. 10-2009-0061704
Dec. 15, 2009 (KR) .................. 10-2009-0124715

(51) Int. Cl.
| H01L 31/042 | (2014.01) |
| H01L 31/18 | (2006.01) |
| H01L 31/05 | (2014.01) |
| H01L 31/0236 | (2006.01) |

(52) U.S. Cl.
CPC ........ H01L 31/0508 (2013.01); H01L 31/0236 (2013.01); *Y02E 10/50* (2013.01)

(58) Field of Classification Search
CPC .................. H01L 31/0236; H01L 31/022425; H01L 31/0508
USPC .......................... 136/244, 251, 256
See application file for complete search history.

(56) References Cited

U.S. PATENT DOCUMENTS

| 5,430,616 A * | 7/1995 | Katsu et al. ................... 361/809 |
| 2007/0125415 A1* | 6/2007 | Sachs ............................ 136/205 |
| 2009/0277491 A1 | 11/2009 | Nakamura et al. |

FOREIGN PATENT DOCUMENTS

| JP | 2001-352014 A | 12/2001 |
| JP | 2003-224289 A | 8/2003 |
| JP | 2005-302902 A | 10/2005 |
| JP | 2006013406 A * | 1/2006 |
| JP | 2006-059991 A | 3/2006 |
| JP | 2006-080217 A | 3/2006 |
| JP | 2006-278710 A | 10/2006 |
| KR | 2009-0013721 A | 2/2009 |
| WO | WO-2007/043428 A1 | 4/2007 |

OTHER PUBLICATIONS

English translation of JP-2005-302902. Publication Date: Oct. 27, 2005.*
English translation of JP-2006-013406. Publication Date: Jan. 12, 2006.*
English translation of JP2006-059991A.
U.S. Appl. No. 13/401,456, filed Feb. 21, 2012.

* cited by examiner

*Primary Examiner* — Marla D McConnell
(74) *Attorney, Agent, or Firm* — Birch, Stewart, Kolasch & Birch, LLP

(57) ABSTRACT

A solar cell module having an interconnector and a method of fabricating the same are disclosed. The solar cell module includes a plurality of solar cells and an interconnector including a first area electrically connected to one of two adjacent solar cells of the plurality of solar cells, a second area electrically connected to the other of the two adjacent solar cells, and a third area connecting the first area to the second area. At least one of the first area and the second area of the interconnector has at least one uneven surface, and the third area of the interconnector has a substantially planarized surface.

17 Claims, 17 Drawing Sheets

SOLAR CELL MODULE HAVING INTERCONNECTOR AND METHOD OF FABRICATING THE SAME

This application claims priority to and the benefit of Korean Patent Application Nos. 10-2009-0061704 and 10-2009-0124715 respectively filed in the Korean Intellectual Property Office on Jul. 7, 2009 and Dec. 15, 2009, the entire contents of which are incorporated herein by reference.

BACKGROUND OF THE INVENTION

1. Field of the Invention

Embodiments of the invention relate to a solar cell module having an interconnector electrically connecting a plurality of solar cells to one another and a method of fabricating the solar cell module.

2. Description of the Related Art

Recently, as existing energy sources such as petroleum and coal are expected to be depleted, interests in alternative energy sources for replacing the existing energy sources are increasing. Among the alternative energy sources, solar cells generating electric energy from solar energy have been particularly spotlighted.

A conventional solar cell includes a substrate and an emitter layer, each of which is formed of a semiconductor, and electrodes respectively formed on the substrate and the emitter layer. The semiconductors forming the substrate and the emitter layer have different conductive types, such as a p-type and an n-type. A p-n junction is formed at an interface between the substrate and the emitter layer.

If light is incident on the solar cell, electrons inside the semiconductor become free electrons (hereinafter referred to as "electrons") by the photoelectric effect. Further, electrons and holes respectively move to an n-type semiconductor (e.g., the emitter layer) and a p-type semiconductor (e.g., the substrate) according to the p-n junction principle. Then, the electrons and the holes are respectively collected by the respective electrodes electrically connected to the emitter layer and the substrate.

At least one current collector, such as a bus bar, is formed on each of the emitter layer and the substrate. The at least one current collector on the emitter layer is electrically connected to the electrode of the emitter layer, and the at least one current collector on the substrate is electrically connected to the electrode of the substrate.

Because a very small amount of voltage and current are generated from one solar cell having the above-described structure, a solar cell module fabricated by connecting in series or parallel several solar cells to one another is used to obtain a desired output. The solar cell module is a moisture-proof module fabricated in a panel form.

In the solar cell module, the electrons and the holes collected by the current collectors of each of the solar cells are collected by a junction box formed in the rear of the solar cell module, and an interconnector is used to connect the several solar cells to one another.

The interconnector is attached to the current collectors of the several solar cells using infrared rays, a heated gas, a local heating material, a laser, etc., so as to electrically connect the bus bars to one another.

However, the size of a light receiving surface of each of the solar cells of the solar cell module is reduced because of the interconnector. More specifically, because the size of the light receiving surface of the solar cell is reduced by the size occupied by the interconnector, a photoelectric transformation efficiency of the solar cell module is reduced.

Recently, the solar cells are electrically connected to one another using an interconnector having an uneven surface so as to minimize such a problem. In the solar cell module using the interconnector having the uneven surface, a portion (for example, light incident on the uneven surface of the interconnector) of light incident on the light receiving surface of the solar cell is reflected from the uneven surface of the interconnector and then is again incident on the light receiving surface of the solar cell due to light scattering.

In other words, the interconnector having the uneven surface improves the photoelectric transformation efficiency of the solar cell module to increase an output of the solar cell module. However, a process for forming the uneven surface of the interconnector has to be added. Accordingly, the manufacturing cost of the interconnector increases.

Further, because the interconnector is transferred, stored, and used in a state where the interconnector is wound on a spool, a foreign material may be attached to an uneven space between the uneven surface and an even surface (i.e., a planarization surface) of the interconnector. If the planarization surface presses the uneven surface, the uneven surface is deformed. Thus, the light scattering due to the uneven surface is reduced.

Further, because the uneven surface is formed entirely on one surface of a ribbon, when the adjacent solar cells are electrically connected to one another using the ribbon, an attachment strength between the ribbon and a back surface of the substrate of each of the adjacent solar cells is reduced in an attachment portion between the ribbon and a current collector positioned on the back surface of the substrate of each of the adjacent solar cells. Thus, a separate adhesive has to be used so as to prevent a reduction in the attachment strength resulting from the uneven surface of the ribbon.

SUMMARY OF THE INVENTION

In one aspect, there is a solar cell module including a plurality of solar cells and an interconnector including a first area electrically connected to one of two adjacent solar cells of the plurality of solar cells, a second area electrically connected to the other of the two adjacent solar cells, and a third area connecting the first area to the second area, wherein at least one of the first area and the second area of the interconnector has at least one uneven surface, and the third area of the interconnector has a substantially planarized surface.

The interconnector has a first surface facing a light source and a second surface opposite the first surface. The at least one uneven surface includes a first uneven surface formed on a first surface of the first area and a second uneven surface formed on a second surface of the second area. In this case, the interconnector may have only the first uneven surface or both the first uneven surface and the second uneven surface.

Each of the first and second uneven surfaces includes at least one of a plurality of convex portions and a plurality of concave portions.

The at least one of the plurality of convex portions and the plurality of concave portions may be uniformly distributed. The at least one of the plurality of convex portions and the plurality of concave portions may be non-uniformly distributed. The at least one of the plurality of convex portions and the plurality of concave portions may be distributed in an island form.

When the interconnector has the first and second uneven surfaces, the plurality of convex portions or the plurality of concave portions on the second uneven surface may be distributed in the same form as or in a different form from the plurality of convex portions or the plurality of concave portions on the first uneven surface.

The plurality of convex portions or the plurality of concave portions may have a uniform size or a non-uniform size. When the interconnector has the first and second uneven surfaces, the plurality of convex portions or the plurality of concave portions on the second uneven surface may have a uniform size or a non-uniform size in the same manner as the plurality of convex portions or the plurality of concave portions on the first uneven surface.

Each of the plurality of convex portions on the first uneven surface may have a pyramid shape or a straight prism shape. Each of the plurality of pyramid-shaped convex portions has four inclined faces, and an angle between opposite inclined faces of the four inclined faces is substantially 100° to 140°. Each of the plurality of straight prism-shaped convex portions has two inclined faces, and an angle between the two inclined faces is substantially 100° to 140°.

When the interconnector has the first and second uneven surfaces, the plurality of convex portions on the second uneven surface may have the same shape as or a different shape from the plurality of convex portions on the first uneven surface.

At least one of the plurality of concave portions on the first uneven surface and the plurality of concave portions on the second uneven surface may have a semicircular, semi-oval, or V-shaped cross section. At least one of the plurality of concave portions on the first uneven surface and the plurality of concave portions on the second uneven surface may have a circular or rectangular plane.

The first, second, and third areas of the interconnector may have the same width. A width of the second area of the interconnector may be greater than a width of the first area of the interconnector. When the width of the second area is greater than the width of the first area, the third area of the interconnector may have a gradually increasing width as it goes from a portion of the first area to a portion of the second area.

The interconnector may include a conductive metal part formed of one of Cu, Al, and Ag.

In another aspect, there is a method of fabricating a solar cell module including disposing a plurality of solar cells, electrically connecting the plurality of solar cells to one another using an interconnector, and forming at least one uneven surface on at least a portion of the interconnector.

The electrically connecting of the solar cells and the forming of the at least one uneven surface may be simultaneously performed. The forming of the at least one uneven surface of the interconnector may include imparting an uneven surface shape of an uneven surface forming member on to the at least a portion of the interconnector.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
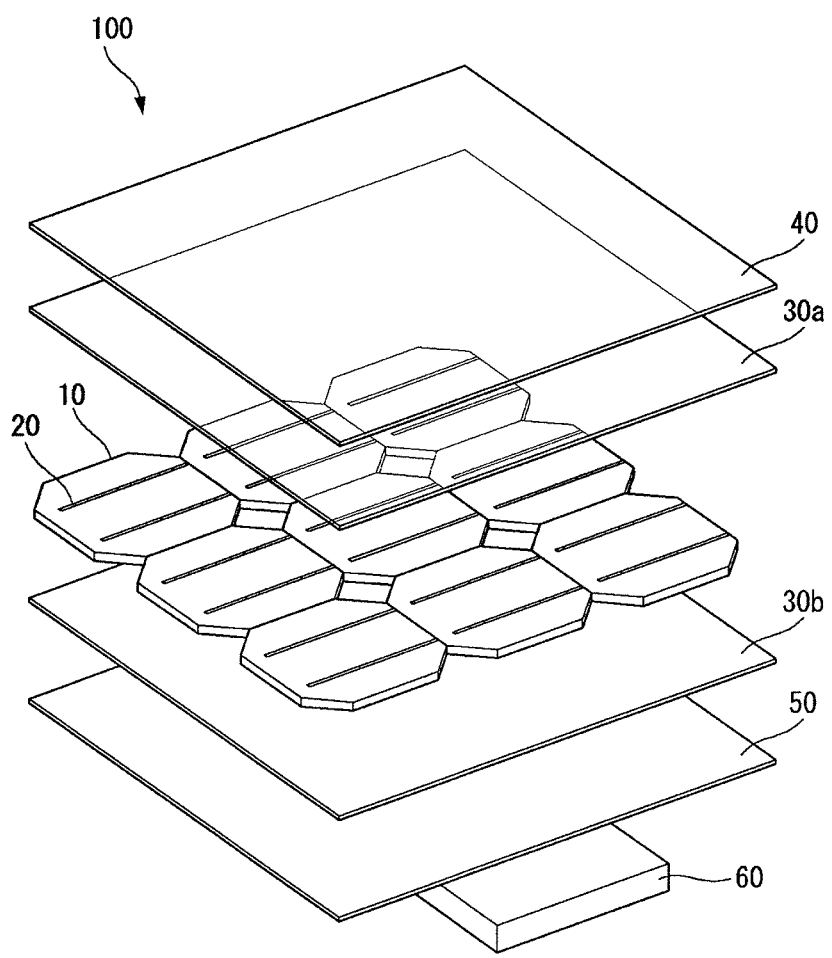
FIG. 1 is an exploded perspective view of a solar cell module according to an embodiment of the invention.

The invention will be described more fully hereinafter with reference to the accompanying drawings, in which example embodiments of the inventions are shown. This invention may, however, be embodied in many different forms and should not be construed as limited to the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Reference will now be made in detail to embodiments of the invention, examples of which are illustrated in the accompanying drawings. FIG. 1 is an exploded perspective view of a solar cell module according to an embodiment of the invention. As shown in FIG. 1, a solar cell module 100 according to an embodiment of the invention includes a plurality of solar cells 10, a plurality of interconnectors 20 electrically connecting the plurality of solar cells 10 to one another, passivation layers 30a and 30b protecting the solar cells 10, a transparent member 40 on the upper passivation layer 30a that is positioned near to light receiving surfaces of the solar cells 10, a back sheet 50 underlying the lower passivation layer 30b that is positioned near to surfaces of the solar cells 10 opposite the light receiving surfaces of the solar cells 10, a frame receiving the components 10, 20, 30a, 30b, 40, and 50 that form an integral body through a lamination process, and a junction box 60 collecting a current and a voltage generated by the solar cells 10.

The back sheet 50 prevents moisture from penetrating in the rear of the solar cell module 100 to protect the solar cells 10 from an external environment. The back sheet 50 may have a multi-layered structure including a layer for preventing moisture and oxygen penetration, a layer for preventing chemical corrosion, and a layer having insulating characteristics, for example.

The passivation layers 30a and 30b and the solar cells 10 form an integral body through the lamination process in a state where the passivation layers 30a and 30b are respectively positioned on upper parts and lower parts of the solar cells 10. The passivation layers 30a and 30b prevent corrosion resulting from the moisture penetration and protect the solar cells 10 from an impact. The passivation layers 30a and 30b may be formed of ethylene vinyl acetate (EVA). Other materials may be used for the passivation layers 30a and 30b.

The transparent member 40 on the upper passivation layer 30a may be formed of tempered glass having a high light transmittance and an excellent damage prevention performance. Other materials may be used. The tempered glass may be low iron tempered glass containing a small amount of iron. The transparent member 40 may have an embossed inner surface so as to increase light scattering.

A method of fabricating the solar cell module 100 sequentially includes testing the solar cells 10, electrically connecting the tested solar cells 10 to one another using the interconnectors 20, successively disposing the back sheet 50, the lower passivation layer 30b, the solar cells 10, the upper passivation layer 30a, and the transparent member 40 from the bottom of the solar cell module 100 in the order named, performing the lamination process in a vacuum state to form an integral body of the components 10, 20, 30a, 30b, 40, and 50, performing an edge trimming process, testing the solar cell module 100, and the like.

Figure 2:
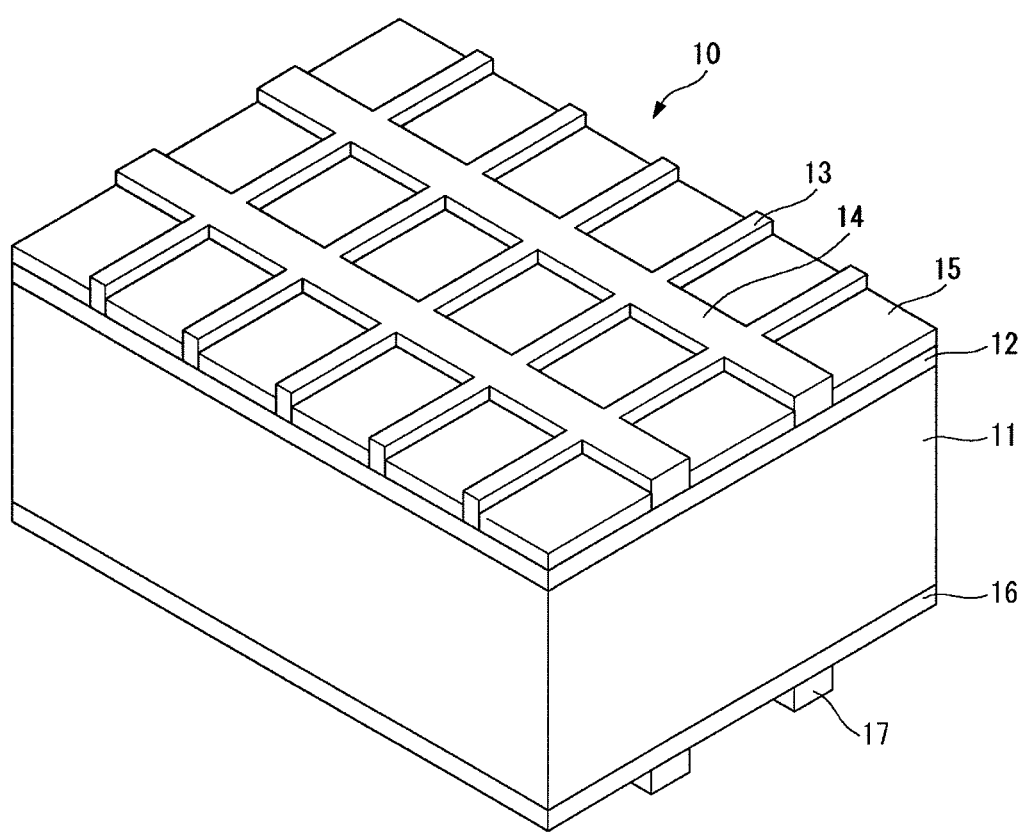
FIG. 2 is a partial perspective view of a solar cell.

FIG. 2 is a partial perspective view of the solar cells 10. As shown in FIG. 2, each of the solar cells 10 includes a substrate 11, an emitter layer 12 on a light receiving surface of the substrate 11 on which light is incident, a plurality of first electrodes 13 on the emitter layer 12, at least one first current collector 14 that is positioned on the emitter layer 12 and extend in a direction crossing the first electrodes 13, an anti-reflection layer 15 on the surface of the emitter layer 12 on which the first electrodes 13 and the at least one first current collector 14 are not formed, and a second electrode 16 and a second current collector 17 that are positioned on the surface of the substrate 11 opposite the light receiving surface of the substrate 11.

Each of the solar cells 10 may further include a back surface field (BSF) layer between the second electrode 16 and the substrate 11. The BSF layer is a region (e.g., a p+-type region) that is more heavily doped with impurities of the same conductive type as the substrate 11 than the substrate 11. Because the BSF layer acts as a potential barrier in the solar cell 10, the BSF layer reduces a recombination and/or a disappearance of electrons and holes in the rear of the substrate 11. Accordingly, efficiency of the solar cells 10 is improved.

The substrate 11 is a semiconductor substrate formed of first conductive type silicon, for example, p-type silicon. Silicon used in the substrate 11 may be single crystal silicon, polycrystalline silicon, or amorphous silicon. If the substrate 11 is of the p-type as above, the substrate 11 may contain impurities of a group III element, such as boron (B), gallium (Ga), and indium (In).

The surface of the substrate 11 may be textured to form a textured surface corresponding to an uneven surface or having uneven characteristics. If the surface of the substrate 11 is a textured surface, a light reflectance in the light receiving surface of the substrate 11 may be reduced. Further, because both a light incident operation and a light reflection operation are performed on the textured surface of the substrate 11, the light may be confined in the solar cell 10. That is, a portion of light incident on the textured surface of the solar cell is reflected from the textured surface and then is again incident on the textured surface of the solar cell due to light scattering. Hence, a light absorptance may increases, and the efficiency of the solar cell 10 may be improved. In addition, because a reflection loss of light incident on the substrate 11 is reduced, an amount of light incident on the substrate 110 may further increase.

The emitter layer 12 is a region doped with impurities of a second conductive type (for example, an n-type) opposite the first conductive type of the substrate 11. The emitter layer 12 and the substrate 11 form a p-n junction. If the emitter layer 12 is of an n-type, the emitter layer 12 may be formed by doping the substrate 11 with impurities of a group V element, such as phosphor (P), arsenic (As), and antimony (Sb).

When electrons inside the semiconductor receive energy by light incident on the substrate 11, the electrons move to an n-type semiconductor and holes move to a p-type semiconductor. Thus, if the substrate 11 is of the p-type and the emitter layer 12 is of the n-type, the holes and the electrons may move to the substrate 11 and the emitter layer 12, respectively.

On the contrary, the substrate 11 may be of an n-type and may be formed of semiconductor materials other than silicon. If the substrate 11 is of the n-type, the substrate 11 may contain impurities of a group V element, such as P, As and Sb.

Because the emitter layer 12 and the substrate 11 form the p-n junction, the emitter layer 12 may be of the p-type if the substrate 11 is of the n-type. In this case, the electrons and the holes may move to the substrate 11 and the emitter layer 12, respectively. If the emitter layer 12 is of the p-type, the emitter layer 12 may be formed by doping the substrate 11 with impurities of a group III element such as B, Ga, and In.

The anti-reflection layer 15 formed of silicon nitride (SiNx) and/or silicon oxide (SiOx) is positioned on the emitter layer 12 formed on the light receiving surface of the substrate 11. The anti-reflection layer 15 reduces a reflectance of light incident on the solar cell 10 and increases a selectivity of a predetermined wavelength band, thereby increasing the efficiency of the solar cell 10. The anti-reflection layer 15 may have a thickness of about 70 nm to 80 nm. The anti-reflection layer 15 may be omitted, if desired.

The plurality of first electrodes 13 are formed on the emitter layer 12 and are electrically connected to the emitter layer 12. In addition, the first electrodes 13 extend in a predetermined direction to be spaced apart from one another. Each of the first electrodes 13 collects carriers (e.g., electrons) moving to the emitter layer 12 and transfer the collected carriers to the first current collector 14 electrically connected to the first electrodes 13.

The plurality of first electrodes 13 are formed of at least one conductive material. More specifically, the first electrodes 13 may be formed of at least one selected from the group consisting of nickel (Ni), copper (Cu), silver (Ag), aluminum (Al), tin (Sn), zinc (Zn), indium (In), titanium (Ti), gold (Au), and a combination thereof. Other conductive materials may be used.

The plurality of first current collectors 14 are formed on the emitter layer 12. The first current collectors 14 may be referred to as a bus bar and extend in a direction crossing the first electrodes 13. Thus, the first electrodes 13 and the first current collectors 14 are positioned on the emitter layer 12 according to a crossing structure.

The first current collectors 14 are formed of at least one conductive material and are electrically connected to the emitter layer 12 and the first electrodes 13. Thus, the first current collectors 14 output carriers (e.g., electrons) transferred from the first electrodes 13 to an external device (e.g., junction box). The first current collectors 14 may be formed of at least one selected from the group consisting of Ni, Cu, Ag, Al, Sn, Zn, In, Ti, Au, and a combination thereof. Other conductive materials may be used.

In the embodiment of the invention, the first current collectors 14 contain the same material as the first electrodes 13. However, the first current collectors 14 may contain a different material from a material of the first electrodes 13. The first electrodes 13 and the first current collectors 14 may be formed on the emitter layer 12 to be electrically connected to the emitter layer 12 by way of coating a conductive material on the anti-reflection layer 15, patterning the coated conductive material according to a pattern shown in FIG. 2, and firing the patterned material to form the first electrodes 13 and the first current collectors 14.

The second electrode 16 is positioned on the surface of the substrate 11 (i.e., a back surface of the substrate 11) opposite the light receiving surface of the substrate 11. The second electrode 16 collects carriers (e.g., holes) moving to the substrate 11. The second electrode 16 is formed of at least one conductive material. More specifically, the second electrode 16 may be formed of at least one selected from the group consisting of Ni, Cu, Ag, Al, Sn, Zn, In, Ti, Au, and a combination thereof. Other conductive materials may be used.

The plurality of second current collectors 17 are positioned under the second electrode 16. The second current collectors 17 are formed in a direction crossing the first electrodes 13, i.e., in a direction parallel to the first current collectors 14. The second current collectors 17 are formed of at least one conductive material and are electrically connected to the second electrode 16. Thus, the second current collectors 17 output carriers (e.g., holes) transferred from the second electrode 16 to an external device. More specifically, the second current collectors 17 may be formed of at least one selected from the group consisting of Ni, Cu, Ag, Al, Sn, Zn, In, Ti, Au, and a combination thereof. Other conductive materials may be used.

An operation of the solar cells 10 according to the embodiment of the invention having the above-described structure is described below. When light incident on the substrate 11 through the anti-reflection layer 15 and the emitter layer 12, free electrons are generated by the photoelectric effect. Then, the electrons move to the n-type emitter layer 12 and the holes move to the p-type substrate 11 according to the p-n junction principle. The electrons moving to the n-type emitter layer 12 are collected by the first electrodes 13 and then are transferred to the first current collectors 14. The holes moving to the p-type substrate 11 are collected by the second electrode 16 and then are transferred to the second current collectors 17.

The above-described solar cells 10 may be individually used. In addition, the plurality of solar cells 10 having the same structure may be electrically connected in series and/or in parallel to one another to form the solar cell module 100 for the efficient use of the solar cells 10.

An electrical connection structure of a solar cell module according to an embodiment of the invention is described below. The plurality of solar cells 10, as shown in FIG. 1, is arranged in a matrix structure. In FIG. 1, the solar cells 10 on the lower passivation layer 30b have a structure of 3×3 matrix, but are not limited thereto. The solar cells 10 may have various matrix structures by reducing or increasing the number of solar cells 10 in row and/or column directions.

Figure 3:
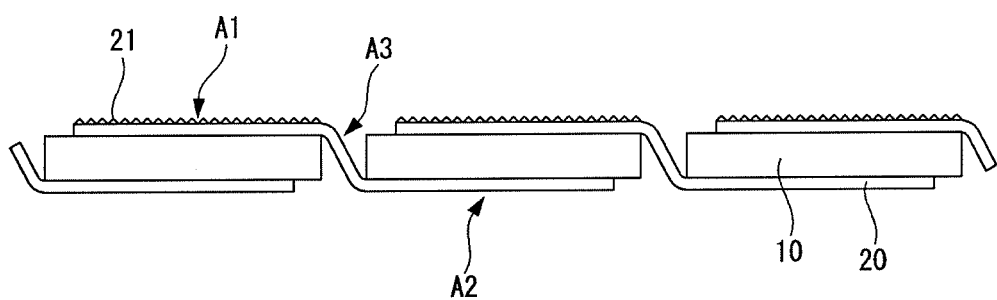
FIG. 3 is a lateral view illustrating an electrical connection structure of a solar cell according to an embodiment of the invention.

As shown in FIG. 3, the plurality of solar cells 10 are electrically connected to one another using the interconnectors 20. More specifically, each of the interconnectors 20 electrically connects first current collectors 14 of one of two adjacent solar cells 10 to second current collectors 17 of the other of the two adjacent solar cells 10.

Each of the interconnectors 20 includes a conductive metal part. The conductive metal part may be formed of one of Cu, Al, and Ag with excellent conductivity. Other materials may be used.

Figure 14A:
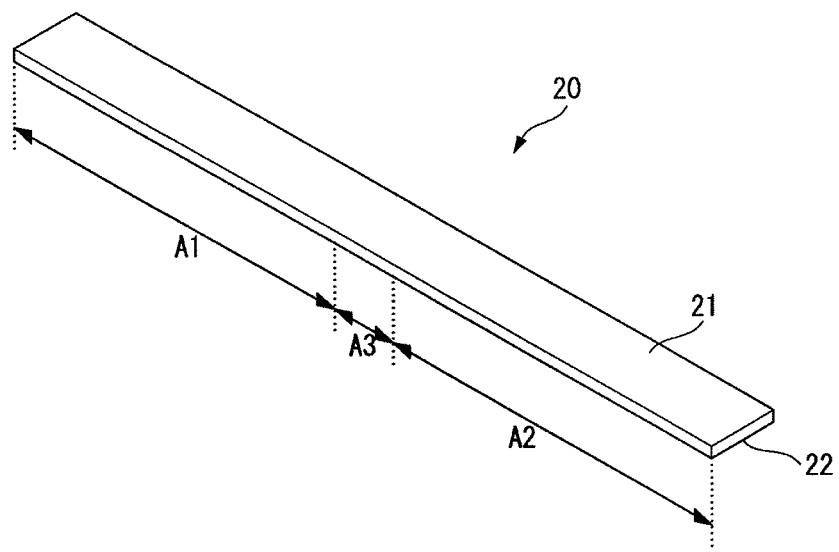
FIGS. 14A and 14B are perspective views of an interconnector used to electrically connect adjacent solar cells to one another in a solar cell module according to an embodiment of the invention.
Figure 14B:
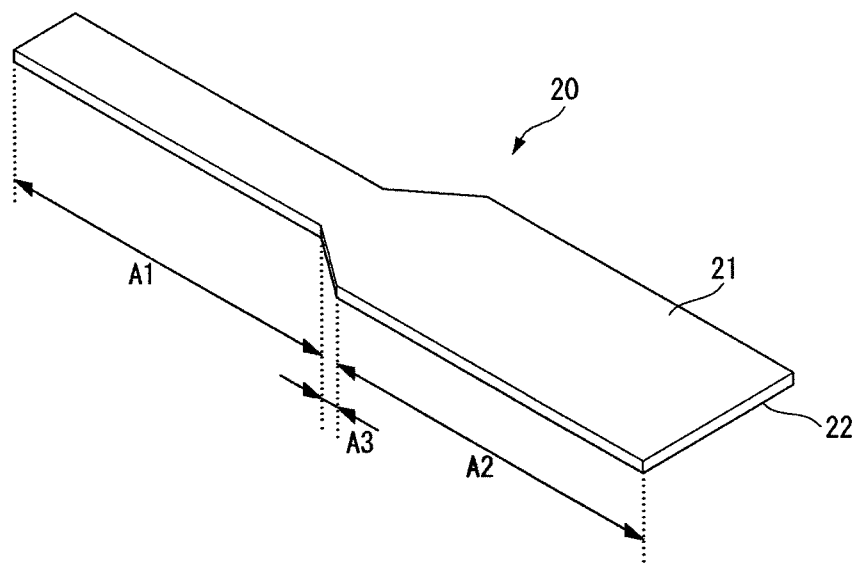

Each of the interconnectors 20 includes a first area A1 attached to the first current collector 14 of one of two adjacent solar cells 10, a second area A2 attached to the second current collector 17 of the other solar cell 10, and a third area A3 connecting the first area A1 to the second area A2. Further, each of the interconnectors 20, as shown in FIGS. 14A and 14B, includes a first surface 21 and a second surface 22 opposite the first surface 21.

In the embodiment of the invention, as shown in FIG. 3, a first uneven surface 23 is formed on the first surface 21 of the first area A1. The first uneven surface 23 may include a plurality of protrusion-shaped convex portions, a plurality of groove-shaped (or depression-shaped) concave portions, or both. Other shaped portions are also possible.

Figure 4A:
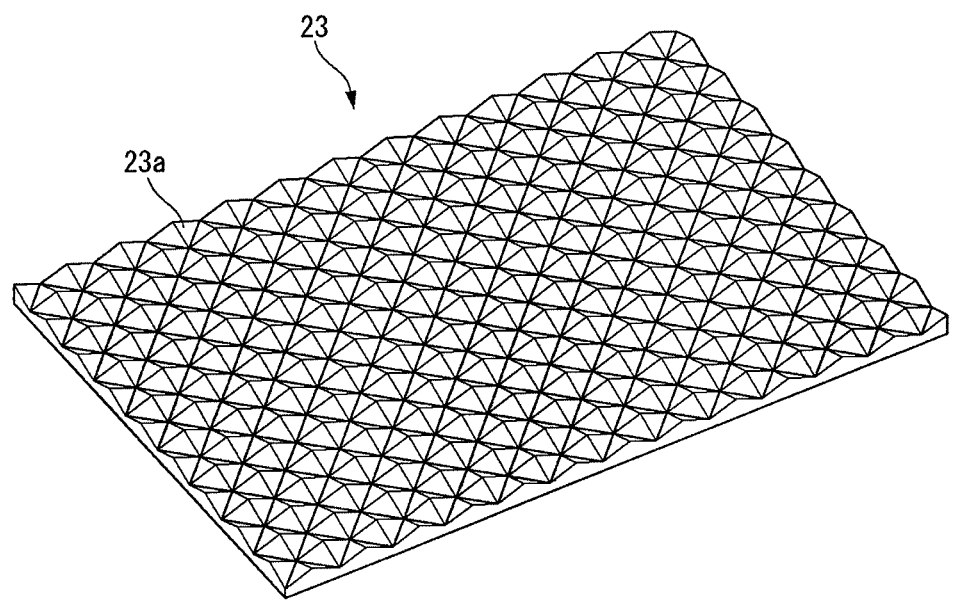
FIGS. 4A and 4B are a perspective view and a cross-sectional view illustrating a portion of a first area of an exemplary interconnector, respectively.
Figure 4B:
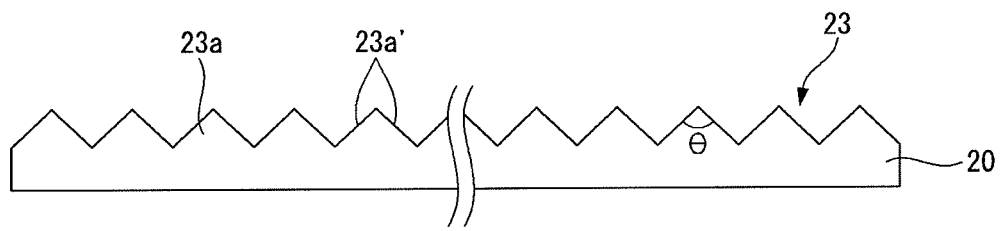

Hereinafter, the interconnector having the first uneven surface 23 including a plurality of protrusion-shaped convex portions is described with reference to FIGS. 4A to 9B. As shown in FIGS. 4A and 4B, the first uneven surface 23 according to the embodiment of the invention includes a plurality of pyramid-shaped convex portions 23a. Each of the pyramid-shaped convex portions 23a has four inclined faces 23a', and an angle θ between two opposite inclined faces 23a' of the four inclined faces 23a' is substantially 100° to 140°. Other angles are also possible.

When the angle θ between the two opposite inclined faces 23a' satisfies the above range, at least 20% of external light incident on the first uneven surface 23 is totally reflected from the inclined faces 23a' of the convex portions 23a and then is again incident on the anti-reflection layer 15. Thus, a light absorptance in the light receiving surfaces of the solar cells 10 efficiently increases.

Each of the pyramid-shaped convex portions 23a may be formed, so that an aspect ratio (i.e., a ratio of a thickness to a width of the convex portion 23a) of each of the pyramid-shaped convex portions 23a is 1 to 2. Other ratios are also possible.

Although FIGS. 4A and 4B illustrate the convex portions 23a having the uniform size, the size of the convex portions 23a may be non-uniform. Those skilled in the art can easily understand the convex portions 23a having the non-uniform size are also possible when referring to FIGS. 4A and 4B.

Figure 5A:
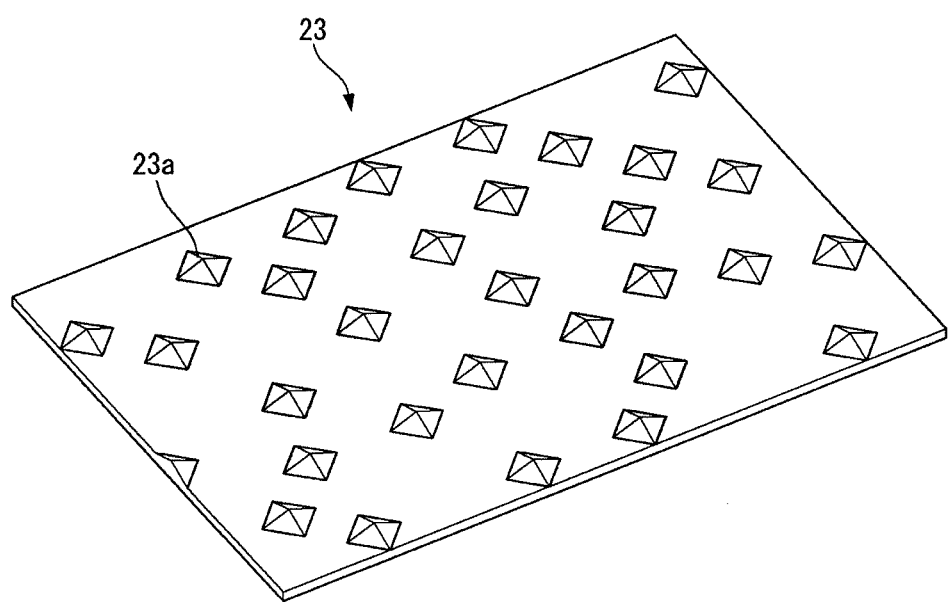
FIGS. 5A and 5B are perspective views illustrating a portion of a first area of another exemplary interconnector.
Figure 5B:
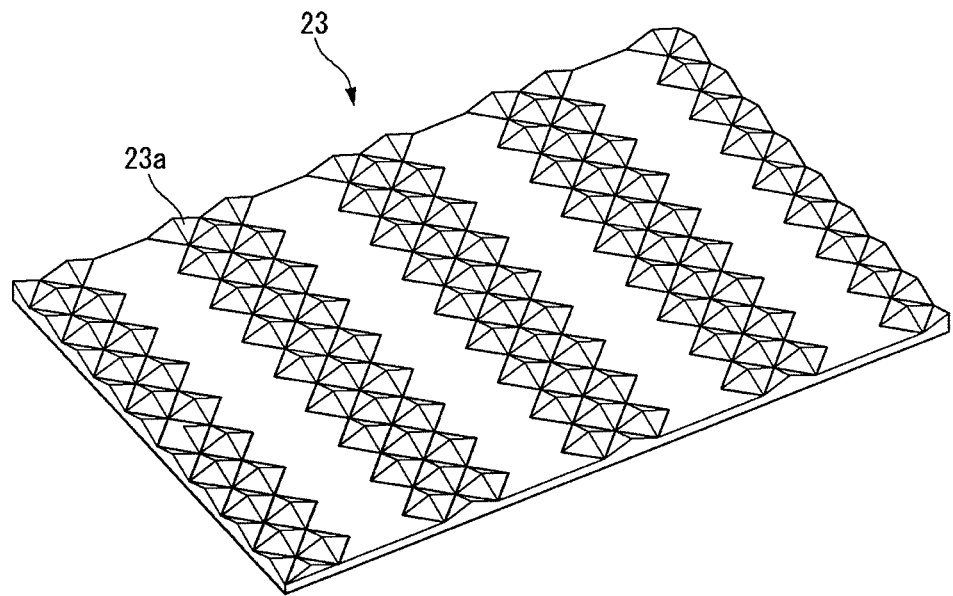

Further, although FIGS. 4A and 4B illustrate the convex portions 23a being uniformly distributed on the first uneven surface 23, the convex portions 23a may be non-uniformly distributed on the first uneven surface 23 as shown in FIG. 5A. Also, as shown in FIG. 5B, the convex portions 23a may be distributed on the first uneven surface 23 in an island form. As above, the convex portions 23a on the first uneven surface 23 may have the uniform size or the non-uniform size and may be distributed uniformly or non-uniformly.

Figure 6A:
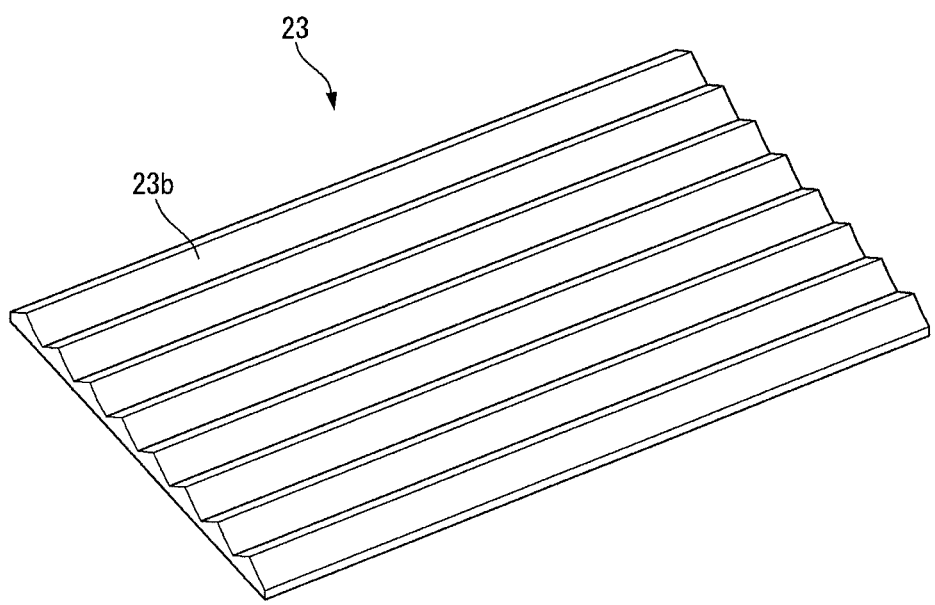
FIGS. 6A and 6B are a perspective view and a cross-sectional view illustrating a portion of a first area of another exemplary interconnector, respectively.
Figure 6B:
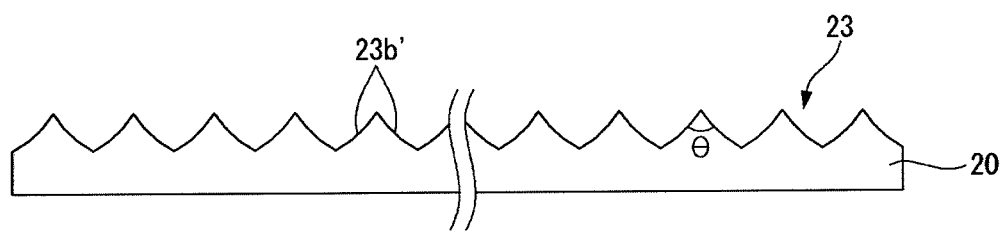

As another example of the convex portions on the first uneven surface 23, as shown in FIGS. 6A and 6B, the first uneven surface 23 may include a plurality of straight prism-shaped convex portions 23b having the uniform size. Each of the straight prism-shaped convex portions 23b has two inclined faces 23b', and an angle θ between the two inclined faces 23b' is substantially 100° to 140°. Other angles are also possible. When the angle θ between the two inclined faces 23b' satisfies the above range, at least 20% of external light incident on the first uneven surface 23 is totally reflected from the inclined faces 23b' of the convex portions 23b and then is again incident on the anti-reflection layer 15.

The straight prism-shaped convex portions 23b having the uniform size may be formed entirely on the first surface 21 of the first area A1. The straight prism-shaped convex portions 23b may be distributed non-uniformly, for example, in an island form in the same manner as the pyramid-shaped convex portions 23a.

Figure 7A:
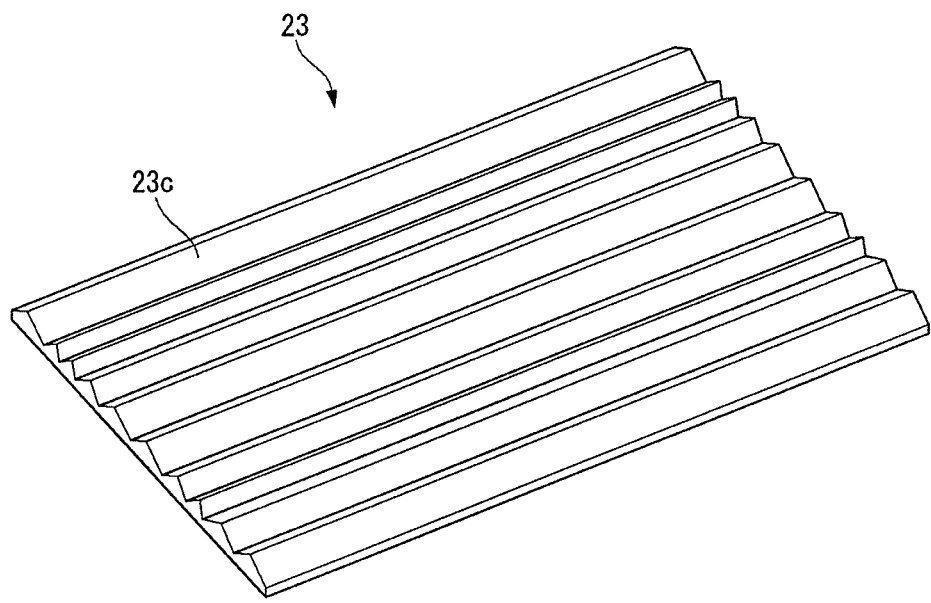
FIGS. 7A and 7B are a perspective view and a cross-sectional view illustrating a portion of a first area of another exemplary interconnector, respectively.
Figure 7B:
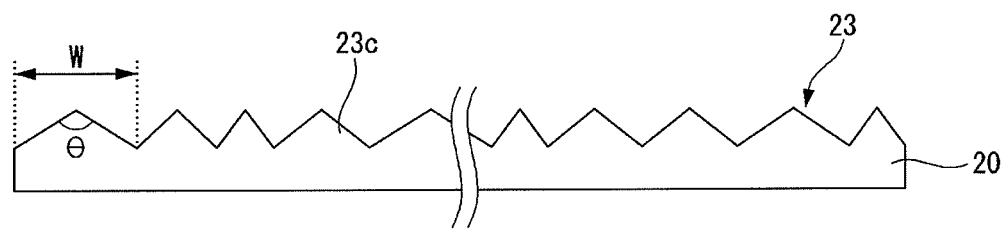

As another example of the convex portions on the first uneven surface 23, as shown in FIGS. 7A and 7B, the first uneven surface 23 may include a plurality of straight prism-shaped convex portions 23c having the non-uniform size. Each of the straight prism-shaped convex portions 23c has two inclined faces 23c', and an angle θ between the two inclined faces 23c' is substantially 100° to 140°. But other angles are also possible.

The straight prism-shaped convex portions 23c having the non-uniform size may be formed entirely on the first surface 21 of the first area A1 in the same manner as the above examples. The straight prism-shaped convex portions 23c may be distributed non-uniformly, for example, in an island form in a portion of the first area A1.

Figure 8A:
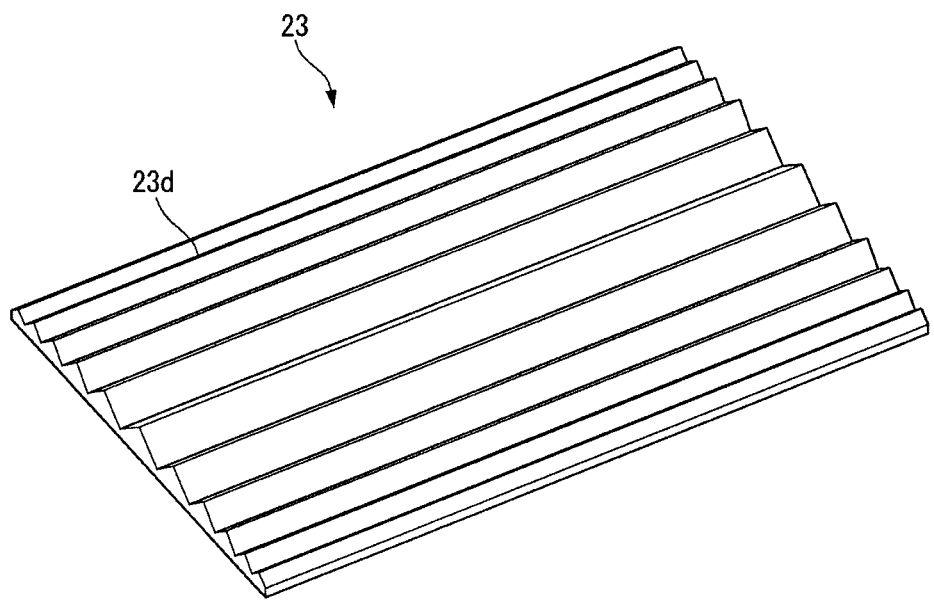
FIGS. 8A and 8B are a perspective view and a cross-sectional view illustrating a portion of a first area of another exemplary interconnector, respectively.
Figure 8B:
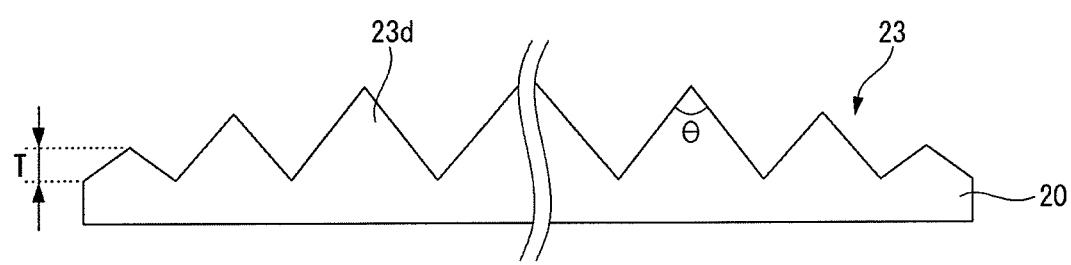

As another example of the convex portions on the first uneven surface 23, as shown in FIGS. 8A and 8B, the first uneven surface 23 may include a plurality of straight prism-shaped convex portions 23d having the non-uniform size.

The straight prism-shaped convex portions 23c shown in FIGS. 7A and 7B have an increasing width W as they go from the middle to an end of the first uneven surface 23 in a width direction. Hence, the straight prism-shaped convex portions 23c have the non-uniform size. On the other hand, the straight prism-shaped convex portions 23d shown in FIGS. 8A and 8B have an increasing thickness T as they go from an end to the middle of the first uneven surface 23 in a width direction. Hence, the straight prism-shaped convex portions 23d have the non-uniform size.

Each of the straight prism-shaped convex portions 23d having the non-uniform size has two inclined faces 23d', and an angle θ between the two inclined faces 23d' is substantially 100° to 140°. Other angles are also possible. The straight prism-shaped convex portions 23d may be formed entirely on the first surface 21 of the first area A1 in the same manner as the above examples. Although it is not shown, the straight prism-shaped convex portions 23d may be distributed non-uniformly, for example, in an island form in a portion of the first area A1.

Figure 9A:
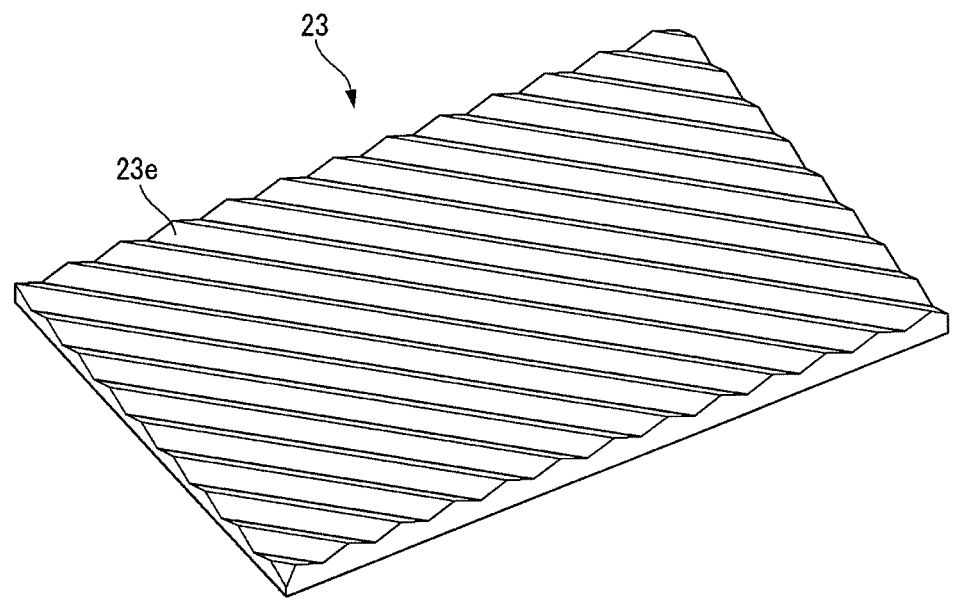
FIGS. 9A and 9B are perspective views illustrating a portion of a first area of another exemplary interconnector.
Figure 9B:
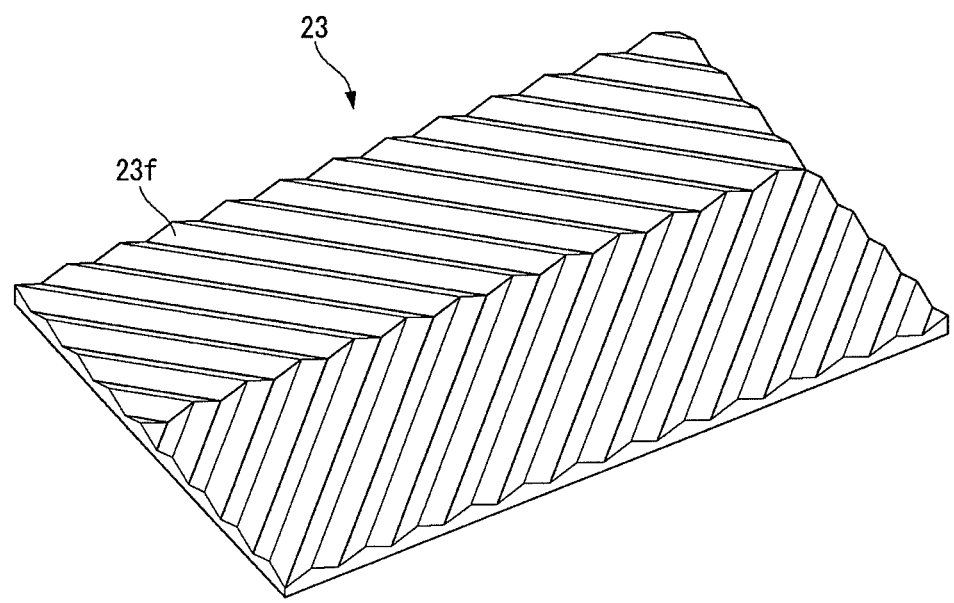

As another example of the convex portions on the first uneven surface 23, as shown in FIGS. 9A and 9B, the first uneven surface 23 may include a plurality of prism-shaped convex portions 23e and 23f having the uniform size. The prism-shaped convex portions 23e and 23f are arranged in an oblique line. The prism-shaped convex portions 23e and 23f may have an angle between inclined surfaces and a distribution in the same manner as the above examples.

Figure 10A:
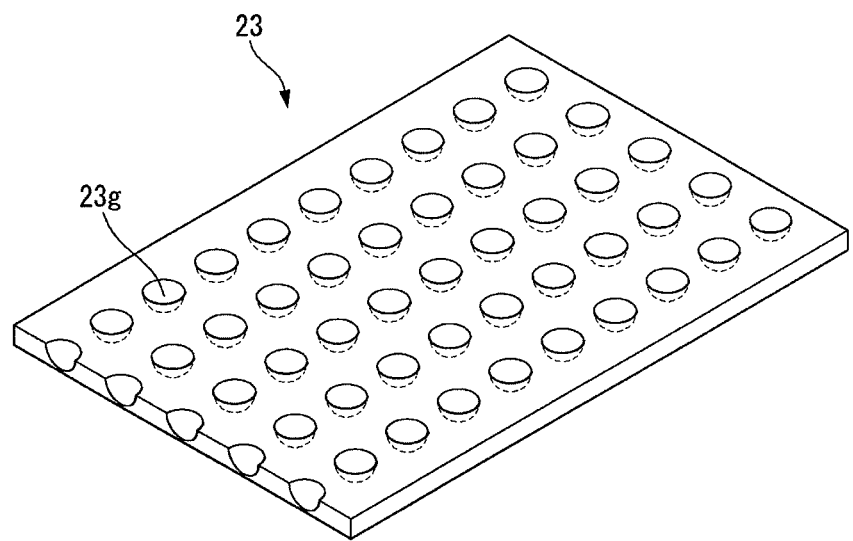
FIGS. 10A and 10B are a perspective view and a cross-sectional view illustrating a portion of a first area of another exemplary interconnector, respectively.
Figure 10B:
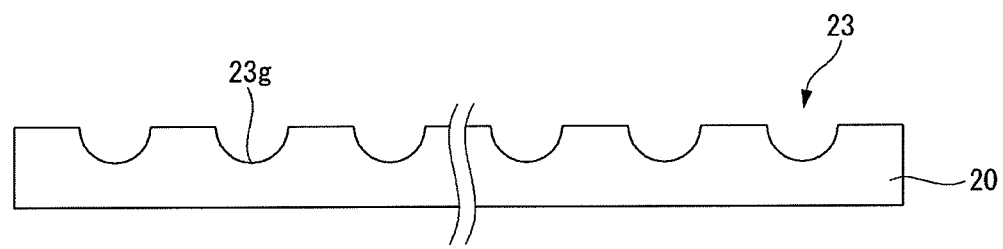

Hereinafter, the interconnector having the first uneven surface 23 including a plurality of groove-shaped concave portions is described with reference to FIGS. 10A to 11C. As shown in FIGS. 10A and 10B, the first uneven surface 23 includes a plurality of concave portions 23g having a semi-circular or semi-oval cross section. The first uneven surface 23 is formed on the first surface 21 of the first area A1. The plurality of concave portions 23g have the uniform size and are uniformly distributed.

Figure 11A:
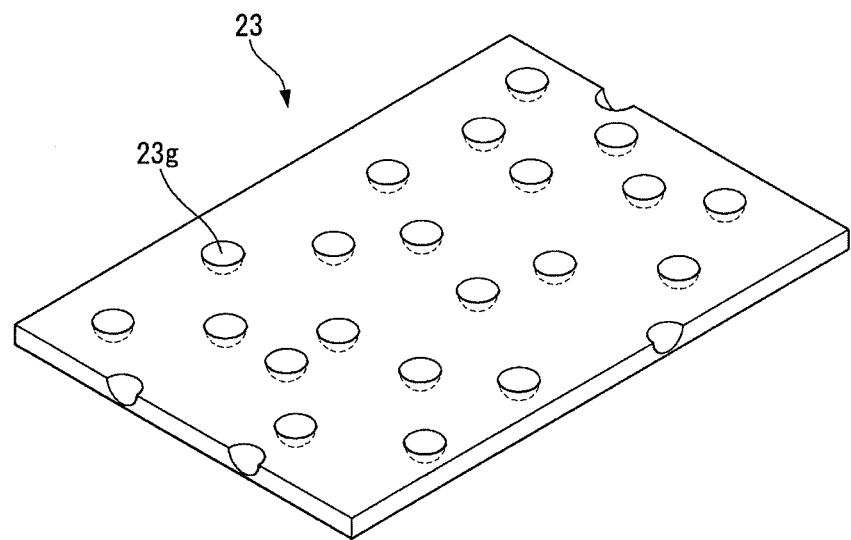
FIGS. 11A to 11C are perspective views illustrating a portion of a first area of another exemplary interconnector.
Figure 11B:
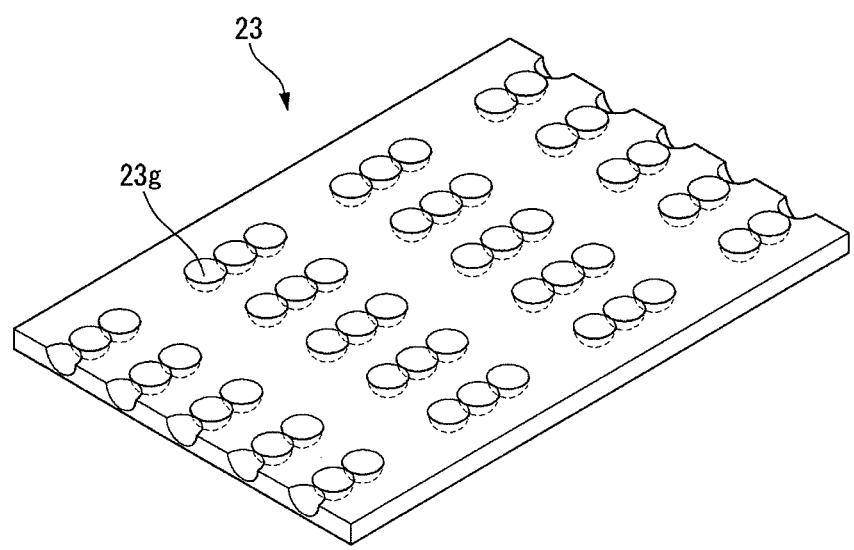

On the other hand, the plurality of concave portions 23g may have the non-uniform size in the same manner as the above examples. The plurality of concave portions 23g may be non-uniformly distributed in the same manner as the above examples as shown in FIG. 11A. For example, as shown in FIG. 11B, the plurality of concave portions 23g may be distributed in an island form. Further, each of the concave portions 23g may be formed, so that an aspect ratio (i.e., a ratio of a depth to a width of the convex portion 23a) of each of the concave portions 23g is 1 to 2. Other ratios are also possible.

Figure 11C:
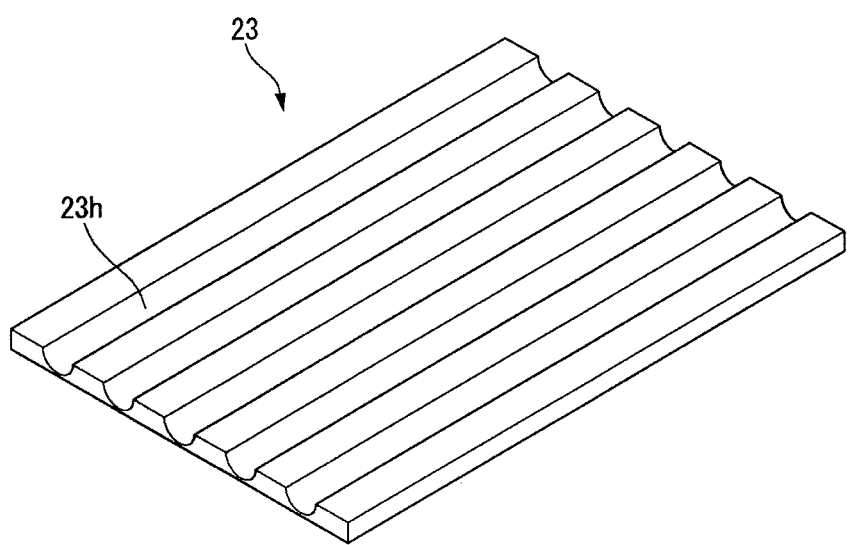

As another example of the concave portions on the first uneven surface 23, as shown in FIG. 11C, a plurality of concave portions 23h on the first uneven surface 23 may have a straight groove shape along a longitudinal direction of the interconnector 20. Although it is not shown, the plurality of concave portions 23h may be arranged in an oblique line in the same manner as the prism-shaped convex portions 23e and 23f.

Figure 12:
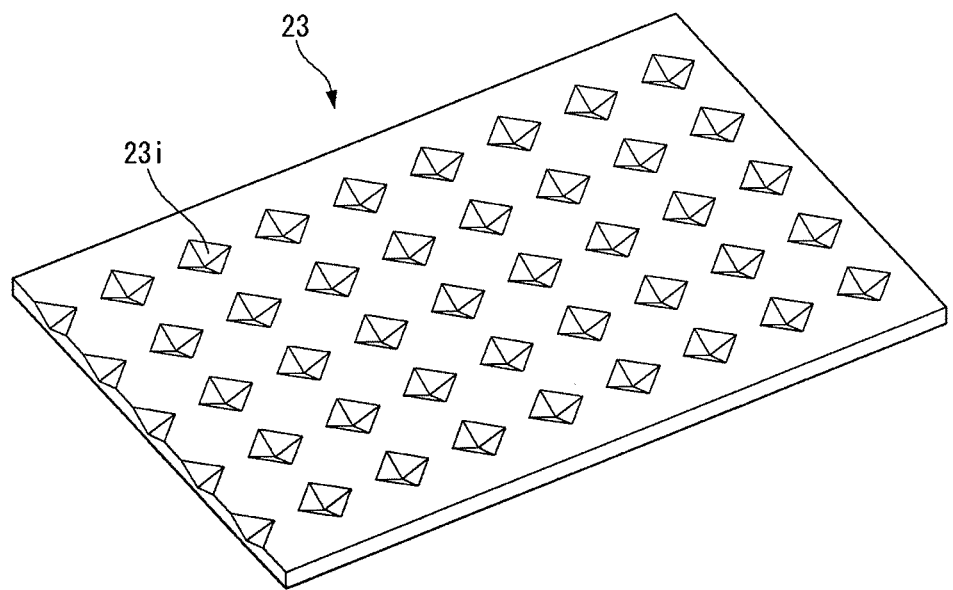
FIG. 12 is a perspective view illustrating a portion of a first area of another exemplary interconnector.

Although FIGS. 10A to 11C illustrate the concave portions 23g and 23h having the semicircular or semi-oval cross section and a circular plane, the first uneven surface 23 may a plurality of concave portions 23i having a V-shaped cross section and a rectangular plane as shown in FIG. 12. The concave portions 23i may be formed in various forms as shown in FIGS. 11A to 11C.

The interconnector 20 in which the first uneven surface 23 is formed on the first surface 21 of the first area A was described above. However, an uneven surface may be formed in the second area A2 of the interconnector 20 in the embodiment of the invention.

Figure 13:
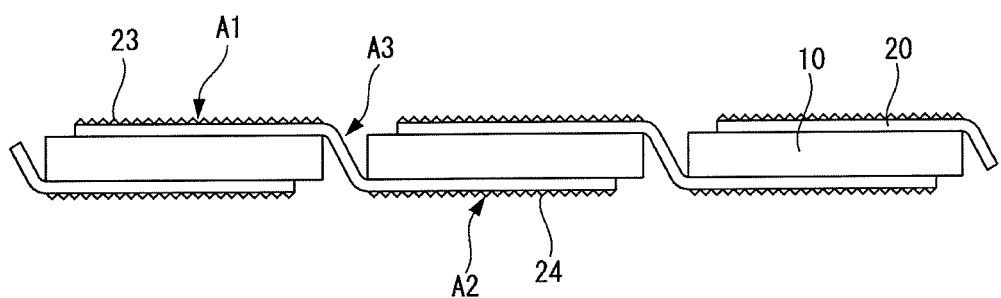
FIG. 13 is a lateral view illustrating an electrical connection structure of a solar cell according to an embodiment of the invention.

As shown in FIG. 13, a second uneven surface 24 is formed on the second surface 22 opposite the first surface 21 in the second area A2 of the interconnector 20. The second uneven surface 24 may have the same configuration as the first uneven surface 23 or a different configuration from the first uneven surface 23.

For example, when the first uneven surface 23 includes a plurality of convex portions, the second uneven surface 24 may include a plurality of convex portions having the same shape as or a different shape from the convex portions of the first uneven surface 23 or may include a plurality of concave portions based on the above-described concave portions of the first uneven surface 23.

Further, when the first uneven surface 23 includes a plurality of concave portions, the second uneven surface 24 may include a plurality of concave portions having the same shape as or a different shape from the concave portions of the first uneven surface 23 or may include a plurality of convex portions based on the above-described convex portions of the first uneven surface 23. As above, each of the first and second uneven surfaces 23 and 24 may include concave portions having various shapes or convex portions having various shapes.

In the interconnector 20 having the first uneven surface 23 and the second uneven surface 24, the first to third areas A1 to A3 may have the same width as shown in FIG. 14A, or a width of the second area A2 may be greater than a width of the first area A1 as shown in FIG. 14B. In the latter case, the third area A3 may have a gradually increasing width as it goes from an end of the first area A1 to the second area A2.

When the width of the second area A2 is greater than the width of the first area A1 as shown in FIG. 14B, a width of the second current collector 17 may increase in the same manner as the second area A2 of the interconnector 20. In other words, the width of the second current collector 17 may be greater than a width of the first current collector 14. Because the second current collector 17 is positioned on the surface opposite the light receiving surface of the substrate 11 and is not related to the size of the light receiving surface, it is possible to increase the width of the second current collector 17. Further, a resistance of the solar cell module 100 may be reduced because of an increase in the width of the second area A2, and thus a current collection efficiency of the solar cell module 100 may be improved.

Although FIGS. 14A and 14B illustrate the interconnector 20 before the uneven surface is formed on the surface of the interconnector 20, the first uneven surface 23 or the first and second uneven surfaces 23 and 24 may be formed on the surface of the interconnector 20 in a fabrication of the solar cell module 100. In the solar cell module 100, the interconnectors 20 connect in series the plurality of solar cells 10 to one another, and a current and a voltage generated in the solar cells 10 are finally collected by the junction box 60.

The method of fabricating the solar cell module 100 according to the embodiment of the invention is described below with reference to FIGS. 15 and 16. As described above, the method of fabricating the solar cell module 100 sequentially includes testing the solar cells 10, arranging the tested solar cells 10 in a matrix structure, electrically connecting the arranged solar cells 10 to one another using the interconnectors 20, successively disposing the back sheet 50, the lower passivation layer 30b, the solar cells 10, the upper passivation layer 30a, and the transparent member 40 from the bottom of the solar cell module 100 in the order named, performing the lamination process in a vacuum state to form an integral body of the components 10, 20, 30a, 30b, 40, and 50, performing the edge trimming process, testing the completed solar cell module 100, and the like.

In the embodiment of the invention, the method further includes forming an uneven surface in at least a portion of each interconnector 20, for example, the first area A1 or the first and second areas A1 and A2 of each interconnector 20. Forming the uneven surfaces of the interconnectors 20 and electrically connecting the solar cells 10 to one another using the interconnectors 20 may be simultaneously performed or may be sequentially performed at a predetermined time interval. However, it is preferable, but not required, that forming the uneven surfaces of the interconnectors 20 and electrically connecting the solar cells 10 to one another using the interconnectors 20 are simultaneously performed for a reduction in processing time.

Figure 15:
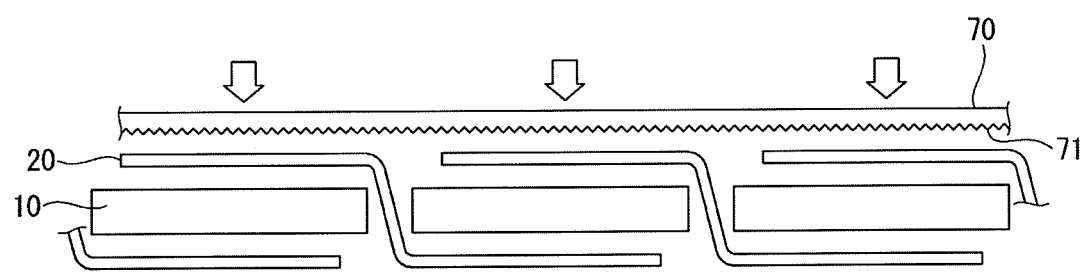
FIGS. 15 and 16 illustrate a method of fabricating a solar cell module according to an embodiment of the invention.
Figure 16:
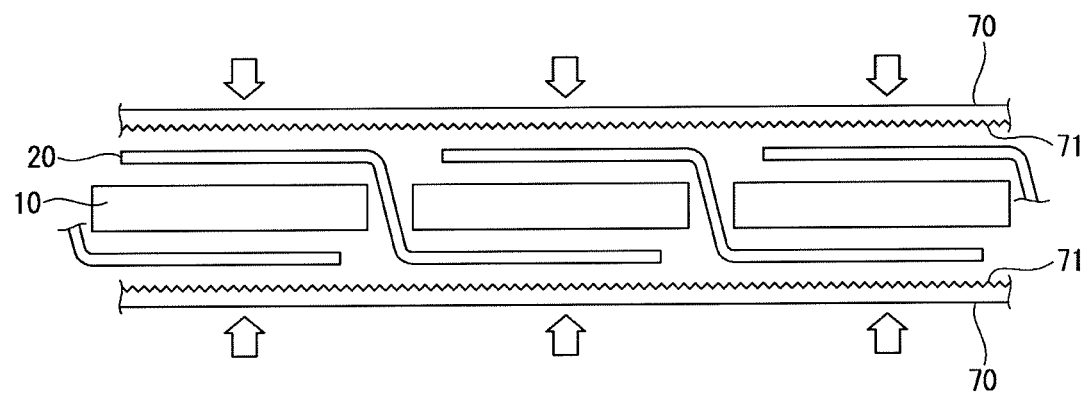

FIGS. 15 and 16 illustrate the method of fabricating the solar cell module 100 when the electrical connection of the solar cells 10 using the interconnectors 20 and the formation of the uneven surfaces of the interconnectors 20 are simultaneously performed. More specifically, FIG. 15 illustrates the method of fabricating the solar cell module 100 using the interconnectors 20 shown in FIG. 3, and FIG. 16 illustrates the method of fabricating the solar cell module 100 using the interconnectors 20 shown in FIG. 13.

As shown in FIG. 15, the interconnectors 20 are positioned on the upper parts and the lower parts of the solar cells 10 so as to electrically connect the interconnectors 20 to the solar cells 10. An uneven surface forming member 70 is positioned over the first areas A1 of the interconnectors 20. The uneven surface forming member 70 has an uneven surface 71 facing the first areas A1. Accordingly, when the interconnectors 20 are electrically connected to the solar cells 10 using a local heating method, for example, the first uneven surface 23 may be formed on the first surface 21 of the first area A1 of each of the interconnectors 20.

As shown in FIG. 16, when the interconnectors 20 are electrically connected to the solar cells 10 using the local heating method, for example, in a state where the uneven surface forming members 70 are respectively positioned over the first area A1 and under the second area A2 of each interconnector 20, the first and second uneven surfaces 23 and 24 may be respectively formed on the first surface 21 of the first area A1 and the second surface 22 of the second surface A2 of each interconnector 20.

The embodiments of the invention illustrate the method of fabricating the solar cell module 100 when the electrical connection of the solar cells 10 using the interconnectors 20 and the formation of the uneven surfaces of the interconnectors 20 are simultaneously performed, but is not limited thereto. For example, after the interconnectors are electrically connected to the solar cells using infrared rays, a heated gas, a laser, etc., the uneven surface of the interconnector may be formed using the uneven surface forming member.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell module, comprising:
a plurality of solar cells which has a front surface facing a light incident direction and a back surface facing opposite to the light incident direction; and
an interconnector including a first area electrically connected to one of two adjacent solar cells of the plurality of solar cells, a second area electrically connected to the other of the two adjacent solar cells, and a third area connecting the first area to the second area,
wherein each of the first, second, and third areas of the interconnector has a first surface and a second surface opposite the first surface respectively,
wherein the first surface of the first area has a first uneven surface, the second surface of the first area is an entirely flat surface, and the entirely flat second surface of the first area entirely electrically contacts the one of the two adjacent solar cells of the plurality of solar cells, the first uneven surface of the first area facing the light incident direction, and the entirely flat second surface of the first area facing the front surface of the one of the two adjacent solar cells,
wherein the second surface of the second area has a second uneven surface, the first surface of the second area is an entirely flat surface, the entirely flat first surface of the second area entirely electrically contacts the other of the two adjacent solar cells of the plurality of solar cells, and the second area is positioned on lower parts of the other of the two adjacent solar cells of the plurality of solar cells, the second uneven surface of the second area facing opposite to the light incident direction, and the entirely flat first surface of the second area facing the back surface of the other of the two adjacent solar cells,
wherein each of the entire first surface and the entire second surface of the third area of the interconnector are entirely flat, wherein a width of the second area of the interconnector is greater than a width of the first area of the interconnector, and wherein the third area of the interconnector has a gradually increasing width as is goes from an end in contact with of the first area of the interconnector to an end in contact with the second area of the interconnector, and the gradually increasing width is symmetric about a centerline of the interconnector.

2. The solar cell module of claim 1, wherein the third area is positioned in a space between the two adjacent solar cells.

3. The solar cell module of claim 1, wherein the first uneven surface of the first area includes at least one of a plurality of convex portions and a plurality of concave portions, and the at least one of the plurality of convex portions and the plurality of concave portions is uniformly distributed, non-uniformly distributed, or distributed in an island form.

4. The solar cell module of claim 3, wherein the at least one of the plurality of convex portions and the plurality of concave portions has a uniform size or a non-uniform size.

5. The solar cell module of claim 3, wherein each of the plurality of convex portions has a pyramid shape or a straight prism shape.

6. The solar cell module of claim 3, wherein each of the plurality of concave portions has a semicircular, semi-oval, or V-shaped cross section.

7. The solar cell module of claim 6, wherein each of the plurality of concave portions has a circular or rectangular plane.

8. The solar cell module of claim 1, wherein the second uneven surface of the second area includes at least one of a plurality of convex portions and a plurality of concave portions.

9. The solar cell module of claim 1, wherein at least one of a plurality of convex portions on the first uneven surface of the first area, a plurality of concave portions on the first uneven surface of the first area, a plurality of convex portions on the second uneven surface of the second area, and a plurality of concave portions on the second uneven surface of the second area is uniformly distributed, non-uniformly distributed, or distributed in an island form.

10. The solar cell module of claim 1, wherein at least one of a plurality of convex portions on the first uneven surface of the first area, a plurality of concave portions on the first uneven surface of the first area, a plurality of convex portions on the second uneven surface of the second area, and a plurality of concave portions on the second uneven surface of the second area has a uniform size or a non-uniform size.

11. The solar cell module of claim 1, wherein at least one of a plurality of convex portions on the first uneven surface of the first area and a plurality of convex portions on the second uneven surface of the second area has a pyramid shape.

12. The solar cell module of claim 11, wherein the plurality of convex portions on the second uneven surface of the second area has the same shape as the plurality of convex portions on the first uneven surface of the first area or a different shape from the plurality of convex portions on the first uneven surface of the first area.

13. The solar cell module of claim 1, wherein at least one of a plurality of convex portions on the first uneven surface of the first area and a plurality of convex portions on the second uneven surface of the second area has a straight prism shape.

14. The solar cell module of claim 13, wherein the plurality of convex portions on the second uneven surface of the second area has the same shape as the plurality of convex portions on the first uneven surface of the first area or a different shape from the plurality of convex portions on the first uneven surface of the first area.

15. The solar cell module of claim 1, wherein at least one of a plurality of concave portions on the first uneven surface of the first area and a plurality of concave portions on the second uneven surface of the second area has a semicircular, semi-oval, or V-shaped cross section.

16. The solar cell module of claim 1, wherein at least one of a plurality of concave portions on the first uneven surface of the first area and a plurality of concave portions on the second uneven surface of the second area has a circular or rectangular plane.

17. The solar cell module of claim 1, wherein a part of the second area includes both a portion of the entirely flat first surface and a portion of the second uneven surface, and wherein the part of the second area entirely physically contacts the back surface of the other of the two adjacent solar cells at the portion of the entirely flat first surface.

* * * * *